US009870830B1

(12) United States Patent
Jeon

(10) Patent No.: US 9,870,830 B1
(45) Date of Patent: Jan. 16, 2018

(54) OPTIMAL MULTILEVEL SENSING FOR READING DATA FROM A STORAGE MEDIUM

(71) Applicant: SanDisk Technologies LLC, Plano, TX (US)

(72) Inventor: Seungjune Jeon, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 13/831,133

(22) Filed: Mar. 14, 2013

(51) Int. Cl.
*G11C 16/34* (2006.01)
*G11C 11/56* (2006.01)

(52) U.S. Cl.
CPC ...... *G11C 16/3459* (2013.01); *G11C 11/5642* (2013.01)

(58) Field of Classification Search
CPC ................ G11C 11/5642; G11C 16/26; G11C 2029/0411; G11C 29/028; G11C 16/0483; G11C 11/56; G11C 2211/5641; G11C 16/3431; G11C 16/3404
See application file for complete search history.

(56) References Cited

U.S. PATENT DOCUMENTS 4,173,737 A 11/1979 Kenos et al.
4,888,750 A 12/1989 Kryder et al.
4,916,652 A 4/1990 Schwarz et al.
5,129,089 A 7/1992 Nielsen
5,270,979 A 12/1993 Harari et al.
5,329,491 A 7/1994 Brown et al.
5,381,528 A 1/1995 Brunelle
(Continued)

FOREIGN PATENT DOCUMENTS

EP 1 299 800 4/2003
EP 1465203 A1 10/2004
(Continued)

OTHER PUBLICATIONS

SanDisk Enterprise IP LLC, International Search Report / Written Opinion, PCT/US2012/059447, dated Jun. 6, 2013, 12 pgs.
(Continued)

*Primary Examiner* — Amir Zarabian
*Assistant Examiner* — Roberto Mancera, Jr.
(74) *Attorney, Agent, or Firm* — Morgan, Lewis & Bockius LLP

(57) ABSTRACT

Systems, methods and/or devices that enhance the reliability with which data can be stored in and read from a memory utilize an error indicator, obtained from using one reading threshold voltage for decoding, to adaptively determine the reading threshold voltage(s) used for subsequent decoding attempts. For example, in some implementations, the method includes initiating performance of a first read operation, using a first reading threshold voltage, to obtain a first error indicator, and further includes initiating performance of a second set of additional read operations using two or more second reading threshold voltages, the second reading threshold voltages determined in accordance with the first error indicator, to obtain a second error indicator. In some embodiments, when the first error indicator is greater than a first threshold, a difference between two of the second reading threshold voltages is greater than when the first error indicator is less than a first threshold.

16 Claims, 7 Drawing Sheets

400

Initiate performance of a first read operation, using a first reading threshold voltage, to obtain a first error indicator — 402
The first error indicator is based at least in part on a syndrome weight — 404
First read operation successful? — 405
Yes: Decoded data made available to host — 407
No
Initiate performance of a second set of additional read operations using two or more second reading threshold voltages, the second reading threshold voltages determined in accordance with the first error indicator, to obtain a second error indicator — 406
When the first error indicator is greater than a first threshold, a difference between two of the second reading threshold voltages is greater than when the first error indicator is less than a first threshold — 408
The first error indicator is based at least in part on a bit error count — 410
Set a set of default reading threshold voltages to the second reading threshold voltages — 412
The two or more second reading threshold voltages are different from the first reading threshold voltage — 414
At least one of the two or more second reading threshold voltages is the same as the first reading threshold voltage — 416
A
A
Initiate performance of a third set of additional read operations using two or more third reading threshold voltages, the third reading threshold voltages determined in accordance with the first error indicator, the second error indicator, or a combination of the first error indicator and the second error indicator, to obtain a third error indicator — 418
The second error indicator is based at least in part on a bit error count — 420
Set a set of default reading threshold voltages to the third reading threshold voltages — 422

(56) References Cited

U.S. PATENT DOCUMENTS 5,404,485 A 4/1995 Ban
5,488,702 A 1/1996 Byers et al.
5,519,847 A 5/1996 Fandrich et al.
5,530,705 A 6/1996 Malone, Sr.
5,537,555 A 7/1996 Landry et al.
5,551,003 A 8/1996 Mattson et al.
5,636,342 A 6/1997 Jeffries
5,657,332 A 8/1997 Auclair et al.
5,666,114 A 9/1997 Brodie et al.
5,708,849 A 1/1998 Coke et al.
5,765,185 A 6/1998 Lambrache et al.
5,890,193 A 3/1999 Chevallier
5,930,188 A 7/1999 Roohparvar
5,938,884 A 8/1999 Hasbun et al.
5,943,692 A 8/1999 Marberg et al.
5,946,714 A 8/1999 Miyauchi
5,982,664 A 11/1999 Watanabe
6,000,006 A 12/1999 Bruce et al.
6,006,345 A 12/1999 Berry, Jr.
6,016,560 A 1/2000 Wada et al.
6,018,304 A 1/2000 Bessios
6,044,472 A 3/2000 Crohas
6,070,074 A 5/2000 Perahia et al.
6,104,304 A 8/2000 Clark et al.
6,119,250 A 9/2000 Nishimura et al.
6,138,261 A 10/2000 Wilcoxson et al.
6,182,264 B1 1/2001 Ott
6,192,092 B1 2/2001 Dizon et al.
6,260,120 B1 7/2001 Blumenau et al.
6,295,592 B1 9/2001 Jeddeloh
6,311,263 B1 10/2001 Barlow et al.
6,408,394 B1 6/2002 Vander Kamp et al.
6,412,042 B1 6/2002 Paterson et al.
6,442,076 B1 8/2002 Roohparvar
6,449,625 B1 9/2002 Wang
6,484,224 B1 11/2002 Robins et al.
6,516,437 B1 2/2003 Van Stralen et al.
6,564,285 B1 5/2003 Mills et al.
6,647,387 B1 11/2003 McKean et al.
6,675,258 B1 1/2004 Bramhall et al.
6,678,788 B1 1/2004 O'Connell
6,728,879 B1 4/2004 Atkinson
6,757,768 B1 6/2004 Potter et al.
6,775,792 B2 8/2004 Ulrich et al.
6,810,440 B2 10/2004 Micalizzi, Jr. et al.
6,836,808 B2 12/2004 Bunce et al.
6,836,815 B1 12/2004 Purcell et al.
6,842,436 B2 1/2005 Moeller
6,865,650 B1 3/2005 Morley et al.
6,871,257 B2 3/2005 Conley et al.
6,895,464 B2 5/2005 Chow et al.
6,934,755 B1 8/2005 Saulpaugh et al.
6,966,006 B2 11/2005 Pacheco et al.
6,978,343 B1 * 12/2005 Ichiriu .......................... 711/108
6,980,985 B1 12/2005 Amer-Yahia et al.
6,981,205 B2 12/2005 Fukushima et al.
6,988,171 B2 1/2006 Beardsley et al.
7,020,017 B2 3/2006 Chen et al.
7,024,514 B2 4/2006 Mukaida et al.
7,028,165 B2 4/2006 Roth et al.
7,032,123 B2 4/2006 Kane et al.
7,043,505 B1 5/2006 Teague et al.
7,043,615 B1 * 5/2006 Kobayashi .......... G06F 12/1441 711/103
7,076,598 B2 7/2006 Wang
7,100,002 B2 8/2006 Shrader
7,102,860 B2 9/2006 Wenzel
7,111,293 B1 9/2006 Hersh et al.
7,126,873 B2 10/2006 See et al.
7,133,282 B2 11/2006 Sone
7,155,579 B1 12/2006 Neils et al.
7,162,678 B2 1/2007 Saliba
7,173,852 B2 2/2007 Gorobets et al.
7,184,446 B2 2/2007 Rashid et al.
7,212,440 B2 5/2007 Gorobets
7,269,755 B2 9/2007 Moshayedi et al.
7,275,170 B2 9/2007 Suzuki
7,295,479 B2 11/2007 Yoon et al.
7,328,377 B1 2/2008 Lewis et al.
7,426,633 B2 9/2008 Thompson et al.
7,486,561 B2 * 2/2009 Mokhlesi ............ G11C 11/5628 365/185.18
7,516,292 B2 4/2009 Kimura et al.
7,523,157 B2 4/2009 Aguilar, Jr. et al.
7,527,466 B2 5/2009 Simmons
7,529,466 B2 5/2009 Takahashi
7,533,214 B2 5/2009 Aasheim et al.
7,546,478 B2 6/2009 Kubo et al.
7,566,987 B2 7/2009 Black et al.
7,571,277 B2 8/2009 Mizushima
7,574,554 B2 8/2009 Tanaka et al.
7,596,643 B2 9/2009 Merry, Jr. et al.
7,669,003 B2 2/2010 Sinclair et al.
7,681,106 B2 3/2010 Jarrar et al.
7,685,494 B1 3/2010 Varnica et al.
7,707,481 B2 4/2010 Kirschner et al.
7,761,655 B2 7/2010 Mizushima et al.
7,765,454 B2 7/2010 Passint
7,774,390 B2 8/2010 Shin
7,809,836 B2 10/2010 Mihm et al.
7,840,762 B2 11/2010 Oh et al.
7,870,326 B2 1/2011 Shin et al.
7,890,818 B2 * 2/2011 Kong .................. G06F 11/1068 365/185.33
7,913,022 B1 3/2011 Baxter
7,925,960 B2 4/2011 Ho et al.
7,934,052 B2 4/2011 Prins et al.
7,945,825 B2 5/2011 Cohen et al.
7,954,041 B2 5/2011 Hong et al.
7,971,112 B2 6/2011 Murata
7,974,368 B2 7/2011 Shieh et al.
7,978,516 B2 7/2011 Olbrich et al.
7,996,642 B1 8/2011 Smith
8,006,161 B2 8/2011 Lestable et al.
8,032,724 B1 10/2011 Smith
8,041,884 B2 10/2011 Chang
8,042,011 B2 10/2011 Nicolaidis et al.
8,069,390 B2 11/2011 Lin
8,190,967 B2 5/2012 Hong et al.
8,250,380 B2 8/2012 Guyot
8,254,181 B2 8/2012 Hwang et al.
8,259,506 B1 9/2012 Sommer et al.
8,261,020 B2 9/2012 Krishnaprasad et al.
8,312,349 B2 11/2012 Reche et al.
8,385,117 B2 * 2/2013 Sakurada ............ G11C 11/5642 365/185.03
8,412,985 B1 4/2013 Bowers et al.
8,429,436 B2 4/2013 Fillingim et al.
8,438,459 B2 5/2013 Cho et al.
8,453,022 B2 * 5/2013 Katz ............................ 714/719
8,473,680 B1 6/2013 Pruthi
8,510,499 B1 8/2013 Banerjee
8,531,888 B2 * 9/2013 Chilappagari ...... G11C 11/5642 365/185.03
8,554,984 B2 10/2013 Yano et al.
8,627,117 B2 1/2014 Johnston
8,634,248 B1 1/2014 Sprouse et al.
8,665,650 B2 * 3/2014 Yang .................. G06F 11/1048 365/185.09
8,694,854 B1 4/2014 Dar et al.
8,700,842 B2 4/2014 Dinker
8,724,789 B2 5/2014 Altberg et al.
8,775,741 B1 7/2014 de la Iglesia
8,788,778 B1 7/2014 Boyle
8,832,384 B1 9/2014 de la Iglesia
8,849,825 B1 9/2014 McHugh et al.
8,874,992 B2 * 10/2014 Desireddi ........... G11C 11/5642 714/704
8,885,434 B2 11/2014 Kumar
8,898,373 B1 11/2014 Kang et al.
8,909,894 B1 12/2014 Singh et al.
8,910,030 B2 12/2014 Goel
8,923,066 B1 * 12/2014 Subramanian et al. . 365/185.21
8,928,681 B1 1/2015 Edmondson et al.

(56) References Cited

U.S. PATENT DOCUMENTS 9,002,805 B1 4/2015 Barber et al.
9,043,517 B1 5/2015 Sprouse et al.
9,052,942 B1 6/2015 Barber et al.
9,063,946 B1 6/2015 Barber et al.
9,110,843 B2 8/2015 Chiu et al.
9,128,690 B2 9/2015 Lotzenburger et al.
9,329,789 B1 5/2016 Chu et al.
9,355,060 B1 5/2016 Barber et al.
9,417,917 B1 8/2016 Barber et al.
2001/0026949 A1 10/2001 Ogawa et al.
2001/0050824 A1 12/2001 Buch
2002/0024846 A1 2/2002 Kawahara et al.
2002/0032891 A1 3/2002 Yada et al.
2002/0036515 A1 3/2002 Eldridge et al.
2002/0083299 A1 6/2002 Van Huben et al.
2002/0099904 A1 7/2002 Conley
2002/0116651 A1 8/2002 Beckert et al.
2002/0122334 A1 9/2002 Lee et al.
2002/0152305 A1 10/2002 Jackson et al.
2002/0162075 A1 10/2002 Talagala et al.
2002/0165896 A1 11/2002 Kim
2003/0041299 A1 2/2003 Kanazawa et al.
2003/0043829 A1 3/2003 Rashid et al.
2003/0079172 A1 4/2003 Yamagishi et al.
2003/0088805 A1 5/2003 Majni et al.
2003/0093628 A1 5/2003 Matter et al.
2003/0163594 A1 8/2003 Aasheim et al.
2003/0163629 A1 8/2003 Conley et al.
2003/0188045 A1 10/2003 Jacobson
2003/0189856 A1 10/2003 Cho et al.
2003/0198100 A1 10/2003 Matsushita et al.
2003/0204341 A1 10/2003 Guliani et al.
2003/0212719 A1 11/2003 Yasuda et al.
2003/0225961 A1 12/2003 Chow et al.
2004/0024957 A1 2/2004 Lin et al.
2004/0024963 A1 2/2004 Talagala et al.
2004/0057575 A1 3/2004 Zhang et al.
2004/0062157 A1* 4/2004 Kawabe .................... 369/44.27
2004/0073829 A1 4/2004 Olarig
2004/0085849 A1 5/2004 Myoung et al.
2004/0114265 A1 6/2004 Talbert
2004/0143710 A1 7/2004 Walmsley
2004/0148561 A1 7/2004 Shen et al.
2004/0153902 A1* 8/2004 Machado et al. ............. 714/710
2004/0158775 A1 8/2004 Shibuya et al.
2004/0167898 A1 8/2004 Margolus et al.
2004/0181734 A1 9/2004 Saliba
2004/0199714 A1 10/2004 Estakhri et al.
2004/0210706 A1 10/2004 In et al.
2004/0237018 A1 11/2004 Riley
2005/0060456 A1 3/2005 Shrader et al.
2005/0060501 A1 3/2005 Shrader
2005/0073884 A1 4/2005 Gonzalez et al.
2005/0108588 A1 5/2005 Yuan
2005/0114587 A1 5/2005 Chou et al.
2005/0138442 A1 6/2005 Keller, Jr. et al.
2005/0144358 A1 6/2005 Conley et al.
2005/0144361 A1 6/2005 Gonzalez et al.
2005/0144367 A1 6/2005 Sinclair
2005/0144516 A1 6/2005 Gonzalez et al.
2005/0154825 A1 7/2005 Fair
2005/0172065 A1 8/2005 Keays
2005/0172207 A1 8/2005 Radke et al.
2005/0193161 A1 9/2005 Lee et al.
2005/0201148 A1 9/2005 Chen et al.
2005/0210348 A1 9/2005 Totsuka
2005/0231765 A1 10/2005 So et al.
2005/0249013 A1 11/2005 Janzen et al.
2005/0251617 A1 11/2005 Sinclair et al.
2005/0257120 A1 11/2005 Gorobets et al.
2005/0273560 A1 12/2005 Hulbert et al.
2005/0281088 A1 12/2005 Ishidoshiro et al.
2005/0289314 A1 12/2005 Adusumilli et al.
2006/0010174 A1 1/2006 Nguyen et al.
2006/0039196 A1 2/2006 Gorobets et al.
2006/0039227 A1 2/2006 Lai et al.
2006/0053246 A1 3/2006 Lee
2006/0062054 A1 3/2006 Hamilton et al.
2006/0069932 A1 3/2006 Oshikawa et al.
2006/0085671 A1 4/2006 Majni et al.
2006/0087893 A1 4/2006 Nishihara et al.
2006/0103480 A1 5/2006 Moon et al.
2006/0107181 A1 5/2006 Dave et al.
2006/0136570 A1 6/2006 Pandya
2006/0136655 A1 6/2006 Gorobets et al.
2006/0136681 A1 6/2006 Jain et al.
2006/0156177 A1 7/2006 Kottapalli et al.
2006/0184738 A1 8/2006 Bridges et al.
2006/0195650 A1 8/2006 Su et al.
2006/0209592 A1 9/2006 Li et al.
2006/0224841 A1 10/2006 Terai et al.
2006/0244049 A1 11/2006 Yaoi et al.
2006/0259528 A1 11/2006 Dussud et al.
2006/0265568 A1 11/2006 Burton
2006/0291301 A1 12/2006 Ziegelmayer
2007/0011413 A1 1/2007 Nonaka et al.
2007/0033376 A1 2/2007 Sinclair et al.
2007/0058446 A1 3/2007 Hwang et al.
2007/0061597 A1 3/2007 Holtzman et al.
2007/0076479 A1 4/2007 Kim et al.
2007/0081408 A1 4/2007 Kwon et al.
2007/0083697 A1 4/2007 Birrell et al.
2007/0088716 A1 4/2007 Brumme et al.
2007/0091677 A1 4/2007 Lasser et al.
2007/0101096 A1 5/2007 Gorobets
2007/0106679 A1 5/2007 Perrin et al.
2007/0113019 A1 5/2007 Beukema et al.
2007/0133312 A1 6/2007 Roohparvar
2007/0147113 A1 6/2007 Mokhlesi et al.
2007/0150790 A1 6/2007 Gross et al.
2007/0156842 A1 7/2007 Vermeulen et al.
2007/0157064 A1 7/2007 Falik et al.
2007/0174579 A1 7/2007 Shin
2007/0180188 A1 8/2007 Fujibayashi et al.
2007/0180346 A1 8/2007 Murin
2007/0191993 A1 8/2007 Wyatt
2007/0201274 A1 8/2007 Yu et al.
2007/0204128 A1 8/2007 Lee et al.
2007/0208901 A1 9/2007 Purcell et al.
2007/0234143 A1 10/2007 Kim
2007/0245061 A1 10/2007 Harriman
2007/0245099 A1 10/2007 Gray et al.
2007/0263442 A1 11/2007 Cornwall et al.
2007/0268754 A1 11/2007 Lee et al.
2007/0277036 A1 11/2007 Chamberlain et al.
2007/0279988 A1 12/2007 Nguyen
2007/0291556 A1 12/2007 Kamei
2007/0294496 A1 12/2007 Goss et al.
2007/0300130 A1 12/2007 Gorobets
2008/0013390 A1 1/2008 Zipprich-Rasch
2008/0019182 A1 1/2008 Yanagidaira et al.
2008/0022163 A1 1/2008 Tanaka et al.
2008/0028275 A1 1/2008 Chen et al.
2008/0043871 A1 2/2008 Latouche et al.
2008/0052446 A1 2/2008 Lasser et al.
2008/0052451 A1 2/2008 Pua et al.
2008/0056005 A1 3/2008 Aritome
2008/0059602 A1 3/2008 Matsuda et al.
2008/0071971 A1 3/2008 Kim et al.
2008/0077841 A1 3/2008 Gonzalez et al.
2008/0077937 A1 3/2008 Shin et al.
2008/0086677 A1 4/2008 Yang et al.
2008/0112226 A1 5/2008 Mokhlesi
2008/0141043 A1 6/2008 Flynn et al.
2008/0144371 A1 6/2008 Yeh et al.
2008/0147714 A1 6/2008 Breternitz et al.
2008/0147964 A1 6/2008 Chow et al.
2008/0147998 A1 6/2008 Jeong
2008/0148124 A1 6/2008 Zhang et al.
2008/0163030 A1 7/2008 Lee
2008/0168191 A1 7/2008 Biran et al.
2008/0168319 A1 7/2008 Lee et al.
2008/0170460 A1 7/2008 Oh et al.
2008/0180084 A1 7/2008 Dougherty et al.

(56) References Cited

U.S. PATENT DOCUMENTS

2008/0201661 A1 8/2008 Haynes et al.
2008/0209282 A1 8/2008 Lee et al.
2008/0229000 A1 9/2008 Kim
2008/0229003 A1 9/2008 Mizushima et al.
2008/0229176 A1 9/2008 Arnez et al.
2008/0270680 A1 10/2008 Chang
2008/0282128 A1* 11/2008 Lee et al. ...................... 714/755
2008/0285351 A1 11/2008 Shtick et al.
2008/0313132 A1 12/2008 Hao et al.
2008/0320110 A1 12/2008 Pathak
2008/0320203 A1 12/2008 Fitzgerald
2009/0003046 A1 1/2009 Nirschl et al.
2009/0003058 A1 1/2009 Kang
2009/0019216 A1 1/2009 Yamada et al.
2009/0031083 A1 1/2009 Willis et al.
2009/0037652 A1 2/2009 Yu et al.
2009/0070608 A1 3/2009 Kobayashi
2009/0116283 A1 5/2009 Ha et al.
2009/0125671 A1 5/2009 Flynn et al.
2009/0144598 A1 6/2009 Yoon et al.
2009/0158288 A1 6/2009 Fulton et al.
2009/0168525 A1 7/2009 Olbrich et al.
2009/0172258 A1 7/2009 Olbrich et al.
2009/0172259 A1 7/2009 Prins et al.
2009/0172260 A1 7/2009 Olbrich et al.
2009/0172261 A1 7/2009 Prins et al.
2009/0172262 A1 7/2009 Olbrich et al.
2009/0172308 A1 7/2009 Prins et al.
2009/0172335 A1 7/2009 Kulkarni et al.
2009/0172499 A1 7/2009 Olbrich et al.
2009/0193058 A1 7/2009 Reid
2009/0204823 A1 8/2009 Giordano et al.
2009/0207660 A1 8/2009 Hwang et al.
2009/0213649 A1 8/2009 Takahashi et al.
2009/0222708 A1 9/2009 Yamaga
2009/0235128 A1* 9/2009 Eun ........................ G11C 16/26
714/704
2009/0249160 A1 10/2009 Gao et al.
2009/0251962 A1 10/2009 Yun et al.
2009/0268521 A1 10/2009 Ueno et al.
2009/0292972 A1 11/2009 Seol et al.
2009/0296466 A1 12/2009 Kim et al.
2009/0296486 A1 12/2009 Kim et al.
2009/0310422 A1 12/2009 Edahiro et al.
2009/0319864 A1 12/2009 Shrader
2010/0002506 A1 1/2010 Cho et al.
2010/0008175 A1 1/2010 Sweere et al.
2010/0011261 A1 1/2010 Cagno et al.
2010/0020620 A1 1/2010 Kim et al.
2010/0037012 A1 2/2010 Yano et al.
2010/0054034 A1 3/2010 Furuta et al.
2010/0061151 A1 3/2010 Miwa et al.
2010/0091535 A1* 4/2010 Sommer et al. ................ 365/45
2010/0103737 A1 4/2010 Park
2010/0110798 A1* 5/2010 Hoei et al. ............... 365/185.24
2010/0115206 A1 5/2010 de la Iglesia et al.
2010/0118608 A1* 5/2010 Song et al. .............. 365/185.11
2010/0138592 A1 6/2010 Cheon
2010/0153616 A1 6/2010 Garratt
2010/0161936 A1 6/2010 Royer et al.
2010/0174959 A1 7/2010 No et al.
2010/0185807 A1 7/2010 Meng et al.
2010/0199027 A1 8/2010 Pucheral et al.
2010/0199125 A1 8/2010 Reche
2010/0199138 A1 8/2010 Rho
2010/0202196 A1 8/2010 Lee et al.
2010/0202239 A1 8/2010 Moshayedi et al.
2010/0208521 A1 8/2010 Kim et al.
2010/0257379 A1 10/2010 Wang et al.
2010/0262889 A1 10/2010 Bains
2010/0281207 A1 11/2010 Miller et al.
2010/0281342 A1 11/2010 Chang et al.
2010/0306222 A1 12/2010 Freedman et al.
2010/0332858 A1 12/2010 Trantham et al.
2010/0332863 A1 12/2010 Johnston
2011/0010514 A1 1/2011 Benhase et al.
2011/0022779 A1 1/2011 Lund et al.
2011/0022819 A1 1/2011 Post et al.
2011/0026159 A1 2/2011 Tsai et al.
2011/0051513 A1 3/2011 Shen et al.
2011/0066597 A1 3/2011 Mashtizadeh et al.
2011/0066806 A1 3/2011 Chhugani et al.
2011/0072207 A1 3/2011 Jin et al.
2011/0072302 A1 3/2011 Sartore
2011/0078407 A1 3/2011 Lewis
2011/0078496 A1 3/2011 Jeddeloh
2011/0083060 A1 4/2011 Sakurada et al.
2011/0099460 A1 4/2011 Dusija et al.
2011/0113281 A1 5/2011 Zhang et al.
2011/0122691 A1 5/2011 Sprouse
2011/0131444 A1 6/2011 Buch et al.
2011/0138260 A1 6/2011 Savin
2011/0173378 A1 7/2011 Filor et al.
2011/0179249 A1 7/2011 Hsiao
2011/0199825 A1 8/2011 Han et al.
2011/0205823 A1 8/2011 Hemink et al.
2011/0213920 A1 9/2011 Frost et al.
2011/0222342 A1 9/2011 Yoon et al.
2011/0225346 A1 9/2011 Goss et al.
2011/0225347 A1 9/2011 Goss et al.
2011/0228601 A1 9/2011 Olbrich et al.
2011/0231600 A1 9/2011 Tanaka et al.
2011/0239077 A1 9/2011 Bai et al.
2011/0264843 A1 10/2011 Haines et al.
2011/0271040 A1 11/2011 Kamizono
2011/0283119 A1 11/2011 Szu et al.
2011/0289125 A1 11/2011 Guthery
2011/0320733 A1 12/2011 Sanford et al.
2012/0011393 A1 1/2012 Roberts et al.
2012/0017053 A1 1/2012 Yang et al.
2012/0023144 A1 1/2012 Rub
2012/0026799 A1 2/2012 Lee
2012/0054414 A1 3/2012 Tsai et al.
2012/0063234 A1 3/2012 Shiga et al.
2012/0072639 A1 3/2012 Goss et al.
2012/0096217 A1 4/2012 Son et al.
2012/0110250 A1 5/2012 Sabbag et al.
2012/0117317 A1 5/2012 Sheffler
2012/0117397 A1 5/2012 Kolvick et al.
2012/0124273 A1 5/2012 Goss et al.
2012/0131286 A1 5/2012 Faith et al.
2012/0151124 A1 6/2012 Baek et al.
2012/0151253 A1 6/2012 Horn
2012/0151294 A1 6/2012 Yoo et al.
2012/0173797 A1 7/2012 Shen
2012/0173826 A1 7/2012 Takaku
2012/0185750 A1 7/2012 Hayami
2012/0195126 A1 8/2012 Roohparvar
2012/0203804 A1 8/2012 Burka et al.
2012/0203951 A1 8/2012 Wood et al.
2012/0210095 A1 8/2012 Nellans et al.
2012/0216079 A1 8/2012 Fai et al.
2012/0233391 A1 9/2012 Frost et al.
2012/0236658 A1 9/2012 Byom et al.
2012/0239858 A1 9/2012 Melik-Martirosian
2012/0239868 A1 9/2012 Ryan et al.
2012/0239976 A1 9/2012 Cometti et al.
2012/0246204 A1 9/2012 Nalla et al.
2012/0259863 A1 10/2012 Bodwin et al.
2012/0275466 A1 11/2012 Bhadra et al.
2012/0278564 A1 11/2012 Goss et al.
2012/0284574 A1* 11/2012 Avila et al. ................... 714/704
2012/0284587 A1 11/2012 Yu et al.
2012/0297122 A1 11/2012 Gorobets
2013/0007073 A1 1/2013 Varma
2013/0007343 A1 1/2013 Rub et al.
2013/0007381 A1 1/2013 Palmer
2013/0007543 A1 1/2013 Goss et al.
2013/0024735 A1 1/2013 Chung et al.
2013/0031438 A1 1/2013 Hu et al.
2013/0036418 A1 2/2013 Yadappanavar et al.
2013/0038380 A1 2/2013 Cordero et al.
2013/0047045 A1* 2/2013 Hu et al. ....................... 714/708
2013/0058145 A1 3/2013 Yu et al.

(56) References Cited

U.S. PATENT DOCUMENTS

2013/0070527 A1 3/2013 Sabbag et al.
2013/0073784 A1 3/2013 Ng et al.
2013/0073798 A1 3/2013 Kang et al.
2013/0073924 A1* 3/2013 D'Abreu et al. ............. 714/763
2013/0079942 A1 3/2013 Smola et al.
2013/0086131 A1 4/2013 Hunt et al.
2013/0086132 A1 4/2013 Hunt et al.
2013/0094288 A1 4/2013 Patapoutian et al.
2013/0103978 A1 4/2013 Akutsu
2013/0110891 A1 5/2013 Ogasawara et al.
2013/0111279 A1* 5/2013 Jeon et al. .................... 714/702
2013/0111298 A1 5/2013 Seroff et al.
2013/0117606 A1 5/2013 Anholt et al.
2013/0121084 A1* 5/2013 Jeon et al. ............... 365/185.24
2013/0124792 A1 5/2013 Melik-Martirosian et al.
2013/0124888 A1 5/2013 Tanaka et al.
2013/0128666 A1 5/2013 Avila et al.
2013/0132647 A1 5/2013 Melik-Martirosian
2013/0132652 A1 5/2013 Wood et al.
2013/0159609 A1 6/2013 Haas et al.
2013/0166824 A1 6/2013 Shim et al.
2013/0176784 A1 7/2013 Cometti et al.
2013/0179646 A1 7/2013 Okubo et al.
2013/0191601 A1 7/2013 Peterson et al.
2013/0194865 A1 8/2013 Bandic et al.
2013/0194874 A1 8/2013 Mu et al.
2013/0232289 A1 9/2013 Zhong et al.
2013/0238576 A1 9/2013 Binkert et al.
2013/0254498 A1 9/2013 Adachi et al.
2013/0254507 A1 9/2013 Islam et al.
2013/0258738 A1* 10/2013 Barkon et al. .................. 365/45
2013/0265838 A1 10/2013 Li
2013/0282955 A1 10/2013 Parker et al.
2013/0290611 A1 10/2013 Biederman et al.
2013/0297613 A1 11/2013 Yu
2013/0301373 A1 11/2013 Tam
2013/0304980 A1 11/2013 Nachimuthu et al.
2013/0314988 A1* 11/2013 Desireddi ........... G11C 11/5642 365/185.03
2013/0343131 A1 12/2013 Wu et al.
2013/0346672 A1 12/2013 Sengupta et al.
2014/0013027 A1 1/2014 Jannyavula Venkata et al.
2014/0013188 A1* 1/2014 Wu et al. ...................... 714/773
2014/0025864 A1 1/2014 Zhang et al.
2014/0032837 A1 1/2014 Nagasaki et al.
2014/0032890 A1 1/2014 Lee et al.
2014/0052928 A1 2/2014 Shimoi
2014/0063905 A1 3/2014 Ahn et al.
2014/0067761 A1 3/2014 Chakrabarti et al.
2014/0071761 A1 3/2014 Sharon et al.
2014/0075133 A1 3/2014 Li et al.
2014/0082261 A1 3/2014 Cohen et al.
2014/0082310 A1 3/2014 Nakajima
2014/0082456 A1 3/2014 Li et al.
2014/0082459 A1 3/2014 Li et al.
2014/0095775 A1 4/2014 Talagala et al.
2014/0101389 A1 4/2014 Nellans et al.
2014/0115238 A1 4/2014 Xi et al.
2014/0122818 A1 5/2014 Hayasaka et al.
2014/0122907 A1 5/2014 Johnston
2014/0136762 A1 5/2014 Li et al.
2014/0136883 A1 5/2014 Cohen
2014/0136927 A1 5/2014 Li et al.
2014/0143505 A1 5/2014 Sim et al.
2014/0153333 A1 6/2014 Avila et al.
2014/0157065 A1 6/2014 Ong
2014/0173224 A1 6/2014 Fleischer et al.
2014/0181458 A1 6/2014 Loh et al.
2014/0201596 A1* 7/2014 Baum ................. G06F 11/1068 714/764
2014/0223084 A1 8/2014 Lee et al.
2014/0244578 A1 8/2014 Winkelstraeter
2014/0258755 A1 9/2014 Stenfort
2014/0269090 A1 9/2014 Flynn et al.
2014/0279909 A1 9/2014 Sudarsanam et al.
2014/0310494 A1 10/2014 Higgins et al.
2014/0359044 A1 12/2014 Davis et al.
2014/0359381 A1 12/2014 Takeuchi et al.
2015/0023097 A1 1/2015 Khoueir et al.
2015/0032967 A1 1/2015 Udayashankar et al.
2015/0037624 A1 2/2015 Thompson et al.
2015/0153799 A1 6/2015 Lucas et al.
2015/0153802 A1 6/2015 Lucas et al.
2015/0212943 A1 7/2015 Yang et al.
2015/0268879 A1 9/2015 Chu
2015/0286438 A1 10/2015 Simionescu et al.

FOREIGN PATENT DOCUMENTS

EP 2 386 958 A1 11/2011
EP 2 620 946 A2 7/2013
JP 2002-532806 S 10/2002
WO WO 2007/036834 A2 4/2007
WO WO 2007/080586 A2 7/2007
WO WO 2008/075292 A2 6/2008
WO WO 2008/121553 10/2008
WO WO 2008/121577 10/2008
WO WO 2009/028281 A1 3/2009
WO WO 2009/032945 A1 3/2009
WO WO 2009/058140 A1 5/2009
WO WO 2009/084724 7/2009
WO WO 2009/134576 A1 11/2009
WO WO 2011/024015 3/2011

OTHER PUBLICATIONS

SanDisk Enterprise IP LLC, International Search Report / Written Opinion, PCT/US2012/059453, dated Jun. 6, 2013, 12 pgs.
SanDisk Enterprise IP LLC, International Search Report / Written Opinion, PCT/US2012/065914, dated May 23, 2013, 7 pgs.
SanDisk Enterprise IP LLC, International Search Report / Written Opinion, PCT/US2012/065919, dated Jun. 17, 2013, 8 pgs.
SanDisk Enterprise IP LLC, Notification of the Decision to Grant a Patent Right for Patent for Invention, CN 200880127623.8, dated Jul. 4, 2013, 1 pg.
Barr, Introduction to Watchdog Timers, Oct. 2001, 3 pgs.
Kang, A Multi-Channel Architecture for High-Performance NAND Flash-Based Storage System, J. Syst. Archit., 53, Sep. 9, 2007, 15 pgs.
Kim, A Space-Efficient Flash Translation Layer for CompactFlash Systems, May 2002, 10 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, dated Mar. 19, 2009, 7 pgs.
Pliant Technology, International Search Report / Written Opinion, PCT/US08/88136, dated Mar. 19, 2009, 7 pgs.
Pliant Technology, International Search Report / Written Opinion, PCT/US08/88146, dated Feb. 26, 2009, 10 pgs.
Pliant Technology, International Search Report / Written Opinion, PCT/US08/88154, dated Feb. 27, 2009, 9 pgs.
Pliant Technology, Written Opinion, PCT/US08/88164, dated Feb. 13, 2009, 6 pgs.
Pliant Technology, International Search Report / Written Opinion, PCT/US08/88206, dated Feb. 18, 2009, 8 pgs.
Pliant Technology, International Search Report / Written Opinion, PCT/US08/88217, dated Feb. 19, 2009, 7 pgs.
Pliant Technology, International Search Report / Written Opinion, PCT/US08/88229, dated Feb. 13, 2009, 8 pgs.
Pliant Technology, International Search Report / Written Opinion, PCT/US08/88232, dated Feb. 19, 2009, 8 pgs.
Pliant Technology, International Search Report / Written Opinion, PCT/US08/88236, dated Feb. 19, 2009, 7 pgs.
Pliant Technology, International Search Report / Written Opinion, PCT/US2011/028637, dated Oct. 27, 2011, 11 pgs.
Pliant Technology, Supplementary ESR, 08866997.3, dated Feb. 23, 2012, 6 pgs.

(56) References Cited

OTHER PUBLICATIONS

SanDisk Enterprise IP LLC, International Search Report / Written Opinion, PCT/US2012/042771, dated Mar. 4, 2013, 14 pgs.
SanDisk Enterprise IP LLC, International Search Report / Written Opinion, PCT/US2012/065916, dated Apr. 5, 2013, 7 pgs.
SanDisk Enterprise IP LLC, International Search Report / Written Opinion, PCT/US2012/042764, dated Aug. 31, 2012, 12 pgs.
SanDisk Enterprise IP LLC, International Search Report / Written Opinion, PCT/US2012/042775, dated Sep. 26, 2012, 9 pgs.
SanDisk Enterprise IP LLC, International Search Report / Written Opinion, PCT/US2012/059459, dated Feb. 14, 2013, 9 pgs.
SanDisk Enterprise IP LLC, Office Action, CN 200880127623.8, dated Apr. 18, 2012, 12 pgs.
SanDisk Enterprise IP LLC, Office Action, CN 200880127623.8, dated Dec. 31, 2012, 9 pgs.
SanDisk Enterprise IP LLC, Office Action, JP 2010-540863, dated Jul. 24, 2012, 3 pgs.
Watchdog Timer and Power Savin Modes, Microchip Technology Inc., 2005.
Zeidman, 1999 Verilog Designer's Library (04US), 9 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
International Search Report and Written Opinion dated Jul. 25, 2014, received in International Patent Application No. PCT/US2014/029453, which corresponds to U.S. Appl. No. 13/963,444, 9 pages (Frayer).
Lee et al, "A Semi-Preemptive Garbage Collector for Solid State Drives," Apr. 2011, IEEE, pp. 12-21.
Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015. received in International Patent Application No. PCT/US2014/065987, which corresponds to U.S. Appl. No. 14/135,400, 12 pages (George).
International Search Report and Written Opinion dated Mar. 17, 2015, received in International Patent Application No. PCT/US2014/067467, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Delpapa).
International Search Report and Written Opinion dated Jul. 23, 2015, received in International Patent Application No. PCT/US2015/030850, which corresponds to U.S. Appl. No. 14/298,843, 12 pages (Ellis).
International Search Report and Written Opinion dated Jun. 30, 2015, received in International Patent Application No. PCT/US2015/023927, which corresponds to U.S. Appl. No. 14/454,687, 11 pages (Kadayam).
Bayer, "Prefix B-Trees", ip.com Journal, ip.com Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/018255, which corresponds to U.S. Appl. No. 14/336,967, 14 pages (Chander).
Ashkenazi et al., "Platform independent overall security architecture in multi-processor system-on-chip integrated circuits for use in mobile phones and handheld devices," ScienceDirect, Computers and Electrical Engineering 33 (2007), 18 pages.
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
International Search Report and Written Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,260, 13 pages (Fitzpatrick).
Gasior, "Gigabyte's i-Ram storage device, Ram disk without the fuss," The Tech Report, p. 1, Jan. 25, 2006, 5 pages.
IBM Research-Zurich, "The Fundamental Limit of Flash Random Write Performance: Understanding, Analysis and Performance Modeling," Mar. 31, 2010, pp. 1-15.
Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
International Search Report and Written Opinion dated Sep. 14, 2015, received in International Patent Application No. PCT/US2015/036807, which corresponds to U.S. Appl. No. 14/311,152, 9 pages (Higgins).
Office Action dated Jan. 11, 2017, received in Chinese Patent Application No. 201280066282.4, which corresponds to U.S. Appl. No. 13/602,047, 3 pages (Tai).
Office Action dated May 3, 2017, received in Chinese Patent Application No. 201480015991.9, which corresponds to U.S. Appl. No. 13/963,444, 2 pages (Frayer).
International Preliminary Report on Patentability dated Dec. 6, 2016, received in International Patent Application No. PCT/US2015/030850, which corresponds to U.S. Appl. No. 14/298,843, 8 pages (Ellis).
International Preliminary Report on Patentability dated Dec. 20, 2016, received in International Patent Application No. PCT/US2015/036807, which corresponds to U.S. Appl. No. 14/311,152, 6 pages (Higgins).
Oestreicher et al., "Object Lifetimes in Java Card," 1999, USENIX, 10 pages.
Office Action dated Apr. 25, 2016, received in Chinese Patent Application No. 201280066282.4, which corresponds to U.S. Appl. No. 13/602,047, 8 pages (Tai).
International Preliminary Report on Patentability dated May 24, 2016, received in International Patent Application No. PCT/

(56) References Cited

OTHER PUBLICATIONS

US2014/065987, which corresponds to U.S. Appl. No. 14/135,400, 9 pages (George).

* cited by examiner

OPTIMAL MULTILEVEL SENSING FOR READING DATA FROM A STORAGE MEDIUM

TECHNICAL FIELD

The disclosed embodiments relate generally to memory systems, and in particular, to improving the error correction capability when using soft information error control decoding.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

A drawback of increasing storage density is that the stored data is increasingly prone to being stored and/or read erroneously. An error control coding (ECC) engine is utilized to limit the number of uncorrectable errors that are introduced by electrical fluctuations, defects in the storage medium, operating conditions, device history, and/or write-read circuitry, etc.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable reading from a storage medium in a manner that improves the error correction capability when using soft information error control decoding. In one aspect, an error indicator obtained from using one reading threshold voltage for decoding is used to adaptively determine the reading threshold voltage(s) used for subsequent decoding attempts.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
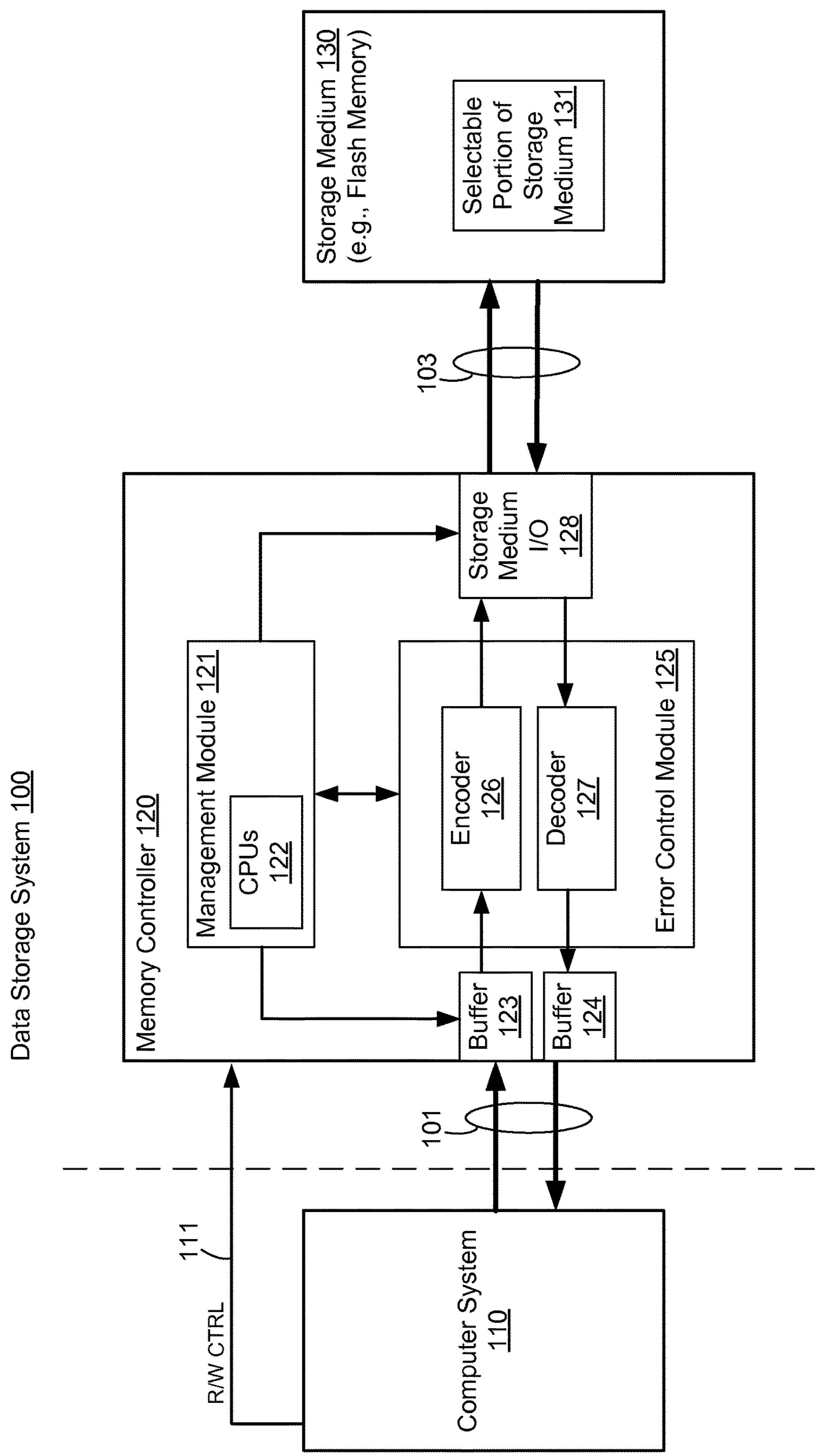
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to improve the error correction capability when using soft information error control decoding. Some implementations include systems, methods and/or devices to obtain and utilize error information for determining reading threshold voltages used for reading symbols from a storage medium.

More specifically, some implementations include a method for reading from a storage medium. In some implementations, the method includes initiating performance of a first read operation, using a first reading threshold voltage, to obtain a first error indicator. The method further includes initiating performance of a second set of additional read operations using two or more second reading threshold voltages, the second reading threshold voltages determined in accordance with the first error indicator, to obtain a second error indicator.

In some embodiments, when the first error indicator is greater than a first threshold, a difference between two of the second reading threshold voltages is greater than when the first error indicator is less than a first threshold.

In some embodiments, the method further includes initiating performance of a third set of additional read operations using two or more third reading threshold voltages, the third reading threshold voltages determined in accordance with the first error indicator, the second error indicator, or a combination of the first error indicator and the second error indicator, to obtain a third error indicator.

In some embodiments, the first error indicator is based at least in part on a syndrome weight.

In some embodiments, the first error indicator is based at least in part on a bit error count, and the method further comprises setting a set of default reading threshold voltages to the second reading threshold voltages.

In some embodiments, the second error indicator is based at least in part on a bit error count, and the method further comprises setting a set of default reading threshold voltages to the third reading threshold voltages.

In some embodiments, the two or more second reading threshold voltages are different from the first reading threshold voltage.

In some embodiments, at least one of the two or more second reading threshold voltages is the same as the first reading threshold voltage.

Some implementations include a method for reading from a storage medium. In some implementations, the method includes initiating performance of a first read operation, using a first reading threshold voltage, to obtain a first error indicator. The method further includes initiating performance of a second read operation using a second reading threshold voltage, the second reading threshold voltage determined in accordance with the first indicator, to obtain a second error indicator.

In some embodiments, when the first error indicator is greater than a first threshold, a difference between the first reading threshold voltage and the second reading threshold voltage is greater than when the first error indicator is less than a first threshold.

In some embodiments, the storage medium comprises one or more flash memory devices.

In another aspect, a device operable to read from a storage medium is configured to read from the storage medium in accordance with any of the methods described above. In some embodiments, the device includes a storage medium interface for coupling the device to the storage medium, means for initiating performance of a first read operation, using a first reading threshold voltage, to obtain a first error indicator, and means for initiating performance of a second set of additional read operations, using two or more second reading threshold voltages, the second reading threshold voltages determined in accordance with the first error indicator, to obtain a second error indicator. In some embodiments, the device includes a storage medium interface for coupling the device to the storage medium, means for initiating performance of a first read operation, using a first reading threshold voltage, to obtain a first error indicator, and means for initiating performance of a second read operation using a second reading threshold voltage, the second reading threshold voltage determined in accordance with the first indicator, to obtain a second error indicator.

In yet another aspect, a non-transitory computer readable storage medium stores one or more programs configured for execution by a device coupled to a storage medium, the one or more programs comprising instructions for causing the device and/or storage medium to read from the storage medium in accordance with any of the methods described above.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 is NAND-type flash memory or NOR-type flash memory. Further, in some implementations memory controller 120 is a solid-state drive (SSD) controller. However, other types of storage media may be included in accordance with aspects of a wide variety of implementations.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, memory controller 120 and storage medium 130 are included in the same device as components thereof. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more CPUs 122 are shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful (e.g., 405—Yes, FIG. 4A), the decoded data is provided to output buffer 124, where the decoded data is made available to computer system 110 (e.g., step 407, FIG. 4A). In some implementations, if the decoding is not successful (e.g., 405—No, FIG. 4A), memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

Figure 2:
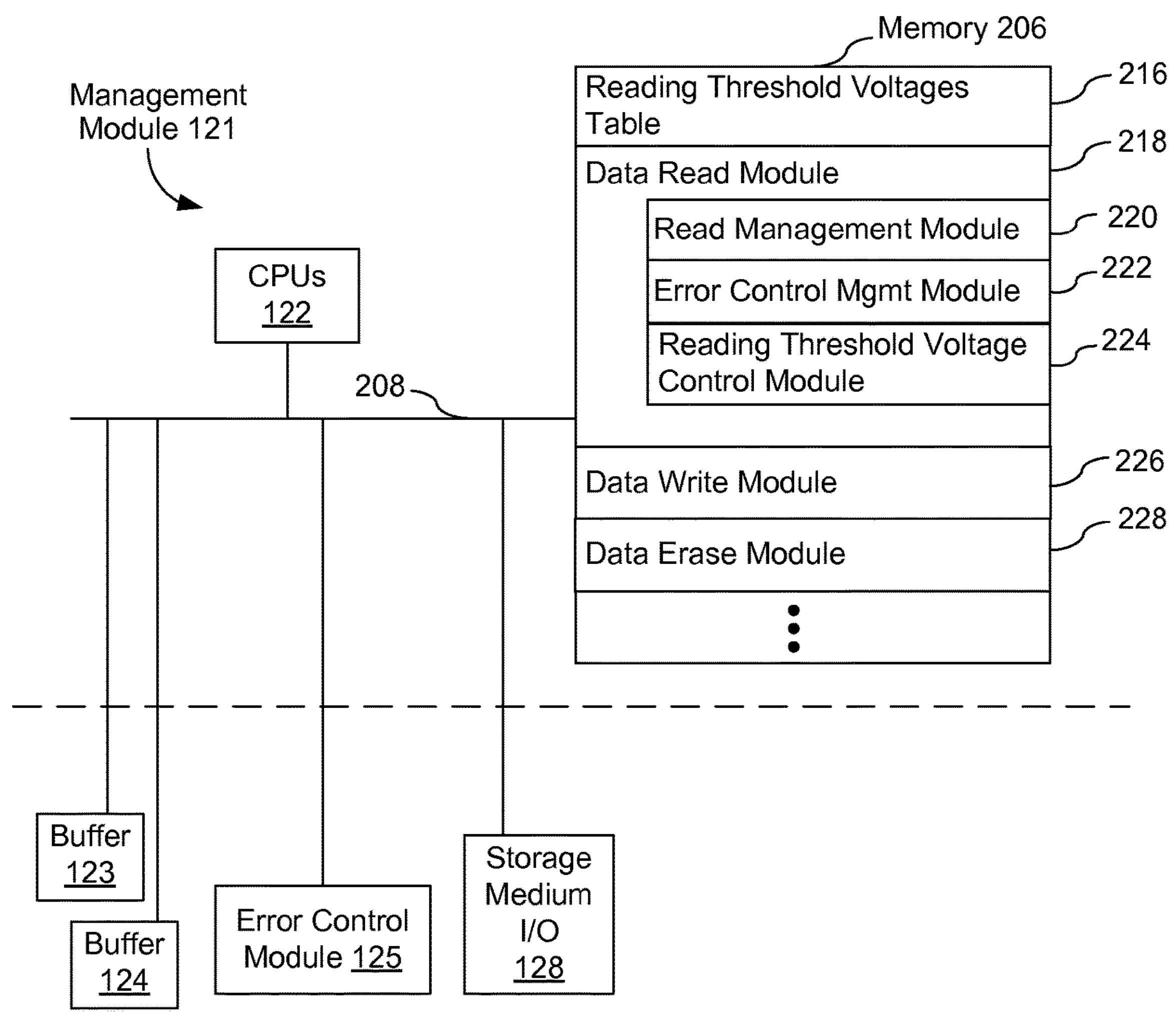
FIG. 2 is a block diagram illustrating an implementation of a management module, in accordance with some embodiments.

FIG. 2 is a block diagram illustrating an exemplary management module 121 in accordance with some embodiments. Management module 121 typically includes one or more processing units (CPUs) 122 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled to buffer 123, buffer 124, error control module 125, and storage medium I/O 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a reading threshold voltages table 216 that includes a table of reading threshold voltages used for reading symbols from a storage medium;
- a data read module 218 that is used for reading data from a storage medium;
- a data write module 226 that is used for writing data to a storage medium; and
- a data erase module 228 that is used for erasing data from a storage medium.

In some embodiments, the data read module 218 optionally includes the following modules or sub-modules, or a subset thereof:

- a read management module 220 that is used for controlling or managing execution of read commands received from a host device such as computer system 110 (FIG. 1);
- an error control management module 222 that is used to receive error indicators (e.g., syndrome weights) from error control module 125, and optionally to control operation of error control module 125; and
- a reading threshold voltage control module 224 that is used for selecting reading threshold voltages from the reading threshold voltages table 216.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 4A-4B and 5.

Although FIG. 2 shows a management module 121, FIG. 2 is intended more as functional description of the various features which may be present in a management module than as a structural schematic of the embodiments described herein. In practice, and as recognized by those of ordinary skill in the art, items shown separately could be combined and some items could be separated.

As discussed below with reference to FIG. 3A, a single-level flash memory cell (SLC) stores one bit ("0" or "1"). Thus, the storage density of a SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of a MLC memory device is multiple-bits per cell (e.g., two bits per memory cell).

Figure 3A:
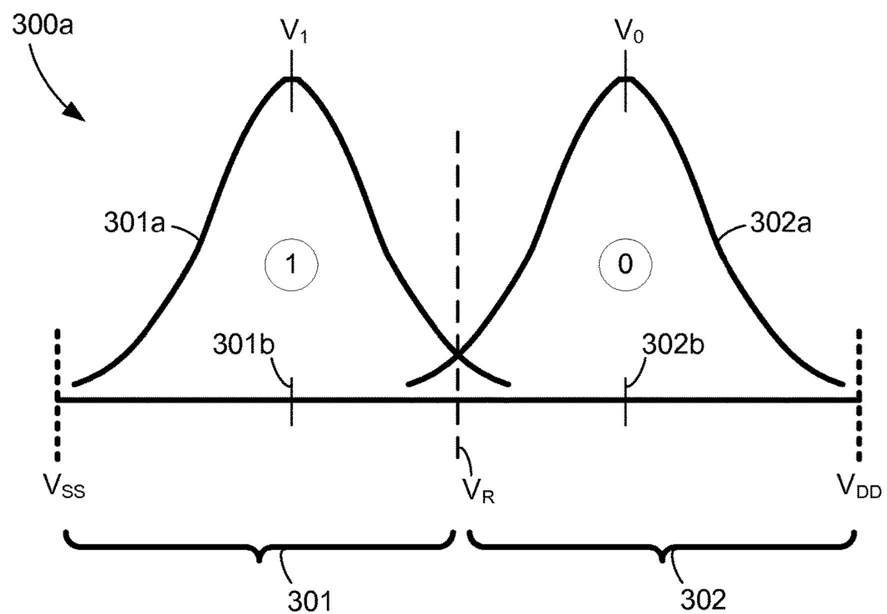
FIG. 3A is a prophetic diagram of voltage distributions that may be found in a single-level flash memory cell (SLC) over time, in accordance with some embodiments.

FIG. 3A is a simplified, prophetic diagram of voltage distributions 300*a* found in a single-level flash memory cell (SLC) over time, in accordance with some embodiments. The voltage distributions 300*a* shown in FIG. 3A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 300*a* extend between $V_{SS}$ and $V_{DD}$.

Sequential voltage ranges 301 and 302 between source voltage $V_{SS}$ and drain voltage $V_{DD}$ are used to represent corresponding bit values "1" and "0," respectively. Each voltage range 301, 302 has a respective center voltage $V_1$ 301*b*, $V_0$ 302*b*. As described above, in many circumstances the memory cell current sensed in response to an applied reading threshold voltages is indicative of a memory cell voltage different from the respective center voltage $V_1$ 301*b* or $V_0$ 302*b* corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301*a*, 302*a* that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301*b* and $V_0$ 302*b*). Optionally, in some implementations, the reading threshold voltage is located between voltage ranges 301 and 302. In some implementations, reading threshold voltage $V_R$ is applied in the region proximate to where the voltage distributions 301*a* and 302*a* overlap, which is not necessarily proximate to the halfway region between adjacent center voltages $V_1$ 301*b* and $V_0$ 302*b*.

In order to increase storage density in flash memory, flash memory has developed from single-level (SLC) cell flash memory to multi-level cell (MLC) flash memory so that two or more bits can be stored by each memory cell. As discussed below with reference to FIG. 3B, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
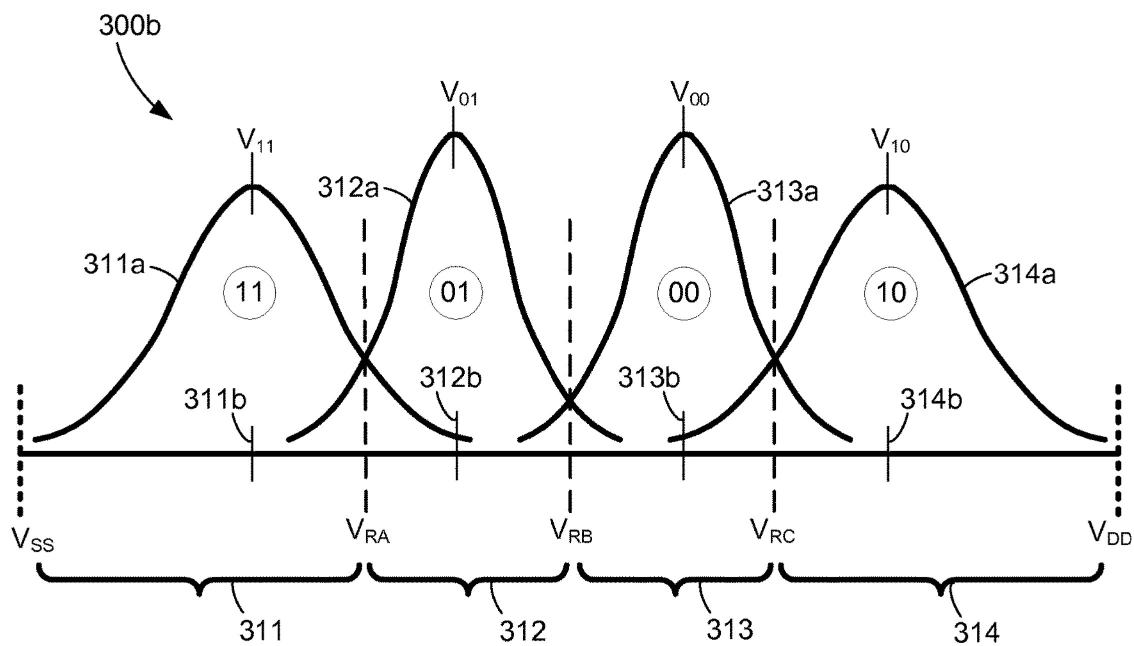
FIG. 3B is a prophetic diagram of voltage distributions that may be found in a multi-level flash memory cell (MLC) over time, in accordance with some embodiments.

FIG. 3B is a simplified, prophetic diagram of voltage distributions 300*b* that may be found in a multi-level flash memory cell (MLC) over time, in accordance with some embodiments. The voltage distributions 300*b* shown in FIG. 3B have been simplified for illustrative purposes. The cell voltage of a MLC approximately extends from a voltage, $V_{SS}$, at the source terminal of a NMOS transistor to a voltage, $V_{DD}$, at the drain terminal. As such, voltage distributions 300*b* extend between $V_{SS}$ and $V_{DD}$.

Sequential voltage ranges 311, 312, 313, 314 between the source voltage $V_{SS}$ and drain voltages $V_{DD}$ are used to represent corresponding bit-tuples "11," "01," "00," "10," respectively. Each voltage range 311, 312, 313, 314 has a respective center voltage 311*b*, 312*b*, 313*b*, 314*b*. Each voltage range 311, 312, 313, 314 also has a respective voltage distribution 311*a*, 312*a*, 313*a*, 314*a* that may occur as a result of any number of a combination of factors, such as electrical fluctuations, defects in the storage medium, operating conditions, device history (e.g., number of program-erase (PE) cycles), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311*b*, $V_{00}$ 312*b*, $V_{00}$ 313*b* and $V_{10}$ 314*b* in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311*b*, $V_{01}$ 312*b*, $V_{00}$ 313*b* or $V_{10}$ 314*b* corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

In some implementations, when encoded data is read from a storage medium (e.g., storage medium 130, FIG. 1) using a reading threshold voltage $V_R$, a decoder (e.g., decoder 127, FIG. 1) applies a decoding process to the encoded data to recover the data, and to correct errors in the recovered data within the error correcting capability of the error control code. In some implementations, after zero iterations or after one iteration of the decoding process, the decoder determines an error indicator. In some embodiments, the error indicator is a syndrome weight, which indicates the number of bit errors detected in a given iteration of the decoding process. A syndrome weight of zero indicates decoding was successful and the data has been recovered.

Figure 3C:
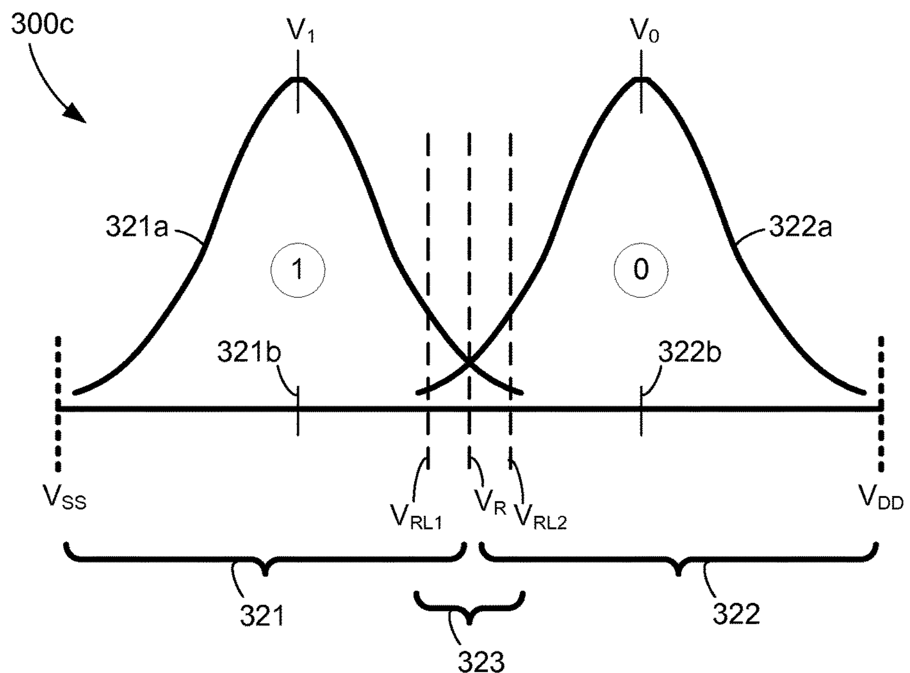
FIG. 3C is a prophetic diagram of voltage distributions that may be found in a single-level flash memory cell (SLC) with a low syndrome weight, showing various reading threshold voltages, in accordance with some embodiments.
Figure 3D:
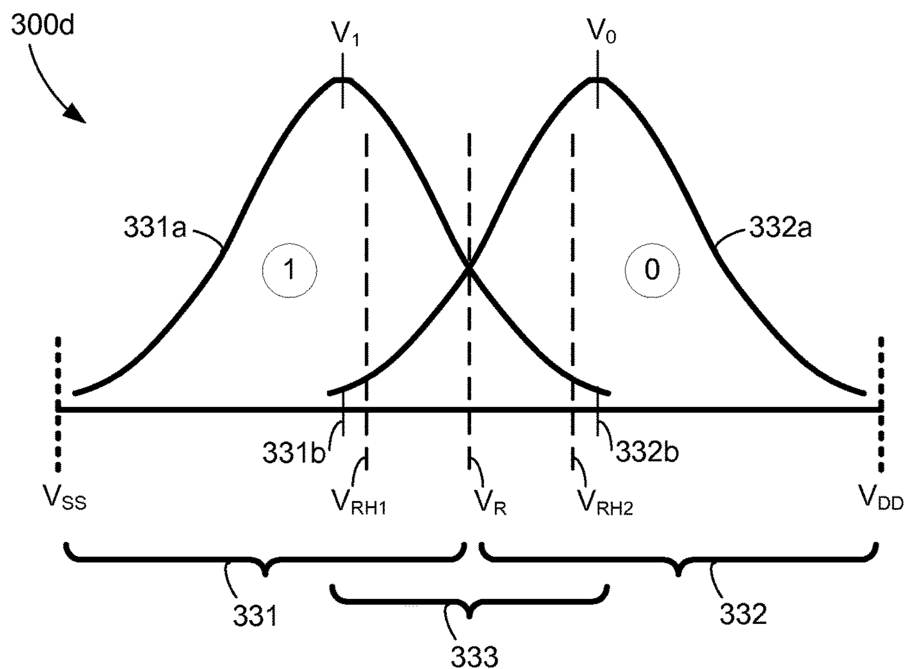
FIG. 3D is a prophetic diagram of voltage distributions that may be found in a single-level flash memory cell (SLC) with a high syndrome weight, showing various reading threshold voltages, in accordance with some embodiments.

In FIG. 3C, the relatively small overlap 323 of voltage distributions 321*a* and 322*a* indicates a smaller area in which errors occur when reading from the memory cell, and thus relates to a low starting syndrome weight. In FIG. 3D, the relatively large overlap 333 of voltage distributions 331*a* and 332*a* indicates a larger area in which errors occur when reading from the memory cell, and thus relates to a high starting syndrome weight.

In some implementations, a decoder processes a read operation using a single reading threshold voltage (e.g., "1-Read decoding"). If the decoding fails or the syndrome weight is too high to be corrected by 1-Read decoding, one or more additional decoding attempts are made with one or more additional read operations using one or more additional reading threshold voltages. For example, if 1-Read decoding fails or if the syndrome weight is too high to be corrected by 1-Read decoding, an additional decoding attempt with two reading threshold voltages (e.g., "2-Read decoding") is made. The error indicator from the 1-Read decoding is used to determine the reading threshold voltages used for the 2-Read decoding. When the error indicator is greater than a threshold, the difference between the two reading threshold voltages used for the 2-Read decoding is greater (e.g., see FIG. 3D, as described below) than when the error indicator is less than a threshold (e.g., see FIG. 3C, as described below). Thus, if the 1-Read decoding produces a high syndrome weight, the two reading threshold voltages used for the 2-Read decoding are widely separated (e.g., in FIG. 3D). In contrast, if the 1-Read decoding produces a low syndrome weight, the two reading threshold voltages used for the 2-Read decoding are narrowly separated (e.g., in FIG. 3C).

Optionally, if 2-Read decoding fails or the syndrome weight is too high to be corrected by 2-Read decoding, one or more additional decoding attempts are made with one or more additional read operations using one or more additional reading threshold voltages. For example, if 2-Read decoding fails or if the syndrome weight is too high to be corrected by 2-Read decoding, an additional decoding attempt with four reading threshold voltages (e.g., "4-Read decoding") is made. In some embodiments, the error indicator from the 1-Read decoding is used to determine the reading threshold voltages used for the 4-Read decoding. In some embodiments, the error indicator from the 2-Read decoding is used to determine the reading threshold voltages used for the 4-Read decoding. In some embodiments, a combination of the error indicator from the 1-Read decoding and the error indicator from the 2-Read decoding is used to determine the reading threshold voltages used for the 4-Read decoding. When the error indicator is greater than a threshold, the difference between the four reading threshold voltages used for the 4-Read decoding is greater than when the error indicator is less than a threshold. Thus, if the 1-Read decoding, 2-Read decoding, or a combination of the 1-Read decoding and 2-Read decoding produces a high syndrome weight, the four reading threshold voltages used for the 4-Read decoding are widely separated. In contrast, if the 1-Read decoding, 2-Read decoding, or a combination of the 1-Read decoding and 2-Read decoding produces a low syndrome weight, the four reading threshold voltages used for the 4-Read decoding are narrowly separated.

Although examples of 1-Read decoding, 2-Read decoding, and 4-Read decoding are used to describe various embodiments, this scheme is applicable to any combination of $N_1$-Read decoding, $N_j$-Read decoding, . . . , and $N_k$-Read decoding, where j is an integer greater than 1 and k is an integer greater than 2. For example, this scheme is applicable to 1-Read decoding, 3-Read decoding, and 5-Read decoding.

In some embodiments, although decoding was successful and the data has been recovered, the decoder determines an error indicator. In some implementations, the error indicator is a bit error count. In some embodiments, the bit error count is called a fail bit count, and indicates the number of bit errors detected in the decoding. After successful decoding, the bit error count is available. In some embodiments, the bit error count is used to adjust and/or update the default reading threshold voltages for subsequent decoding attempts. For example, after a successful 1-Read decoding, the bit error count from the 1-Read decoding is used to adjust and/or update the default reading threshold voltages for subsequent 2-Read decodings.

FIG. 3C is a simplified, prophetic diagram of voltage distributions 300*c* found in a single-level flash memory cell (SLC) with a low syndrome weight, in accordance with some embodiments. Explanations provided above in connection with FIG. 3A, with respect to voltage distributions 300*a*, sequential voltage ranges 301 and 302, center voltages $V_1$ 301*b* and $V_0$ 302*b*, voltage distributions 301*a* and 302*a* and their overlap, and reading threshold voltage $V_R$ are equally applicable to voltage distributions 300*c*, sequential voltage ranges 321 and 322, center voltages $V_1$ 321*b* and $V_0$ 322*b*, voltage distributions 321*a* and 322*a* and their overlap, and reading threshold voltage $V_R$ as shown in FIG. 3C, except as described next.

In FIG. 3C, the relatively small overlap 323 of voltage distributions 321a and 322*a* indicates a smaller area in which errors occur when reading from the memory cell, and thus relates to a low starting syndrome weight. As described above, if a 1-Read decoding produces a low syndrome weight, the two reading threshold voltages used for the 2-Read decoding are narrowly separated. For example, in FIG. 3C, if a 1-Read decoding using reading threshold voltage $V_R$ produces a low syndrome weight, the two reading threshold voltages $V_{RL1}$ and $V_{RL2}$ used for 2-Read decoding are narrowly separated.

Although examples of 1-Read decoding and 2-Read decoding are used in the example of FIG. 3C, this scheme is applicable to any combinations of $N_1$-Read decoding, $N_a$-Read decoding, . . . , and $N_k$-Read decoding, where j is an integer greater than 1 and k is an integer greater than 2. For example, this scheme is applicable to 1-Read decoding, 3-Read decoding, and 5-Read decoding. Similarly, although FIG. 3C illustrates an example using a single-level flash memory cell, this scheme is also applicable to a multi-level flash memory cell (e.g., as illustrated in FIG. 3B).

FIG. 3D is a simplified, prophetic diagram of voltage distributions 300*d* found in a single-level flash memory cell (SLC) with a high syndrome weight, in accordance with some embodiments. Explanations provided above in connection with FIG. 3A, with respect to voltage distributions 300*a*, sequential voltage ranges 301 and 302, center voltages $V_1$ 301*b* and $V_0$ 302*b*, voltage distributions 301*a* and 302*a* and their overlap, and reading threshold voltage $V_R$ are equally applicable to voltage distributions 300*d*, sequential voltage ranges 331 and 332, center voltages $V_1$ 331*b* and $V_0$ 332*b*, voltage distributions 331*a* and 332*a* and their overlap, and reading threshold voltage $V_R$ as shown in FIG. 3D, except as described next.

In FIG. 3D, the relatively large overlap 333 of voltage distributions 331*a* and 332*a* indicates a larger area in which errors occur when reading from the memory cell, and thus relates to a high starting syndrome weight. As described above, if a 1-Read decoding produces a high syndrome weight, the two reading threshold voltages used for the 2-Read decoding are widely separated. For example, in FIG. 3D, if a 1-Read decoding using reading threshold voltage $V_R$ produces a high syndrome weight, the two reading threshold voltages $V_{RH1}$ and $V_{RH2}$ used for 2-Read decoding are widely separated.

Although examples of 1-Read decoding and 2-Read decoding are used in the example of FIG. 3D, this scheme is applicable to any combinations of $N_1$-Read decoding, $N_j$-Read decoding, . . . , and $N_k$-Read decoding, where j is an integer greater than 1 and k is an integer greater than 2. For example, this scheme is applicable to 1-Read decoding, 3-Read decoding, and 5-Read decoding. Similarly, although FIG. 3D illustrates an example using a single-level flash memory cell, this scheme is also applicable to a multi-level flash memory cell (e.g., as illustrated in FIG. 3B).

Figure 4A:
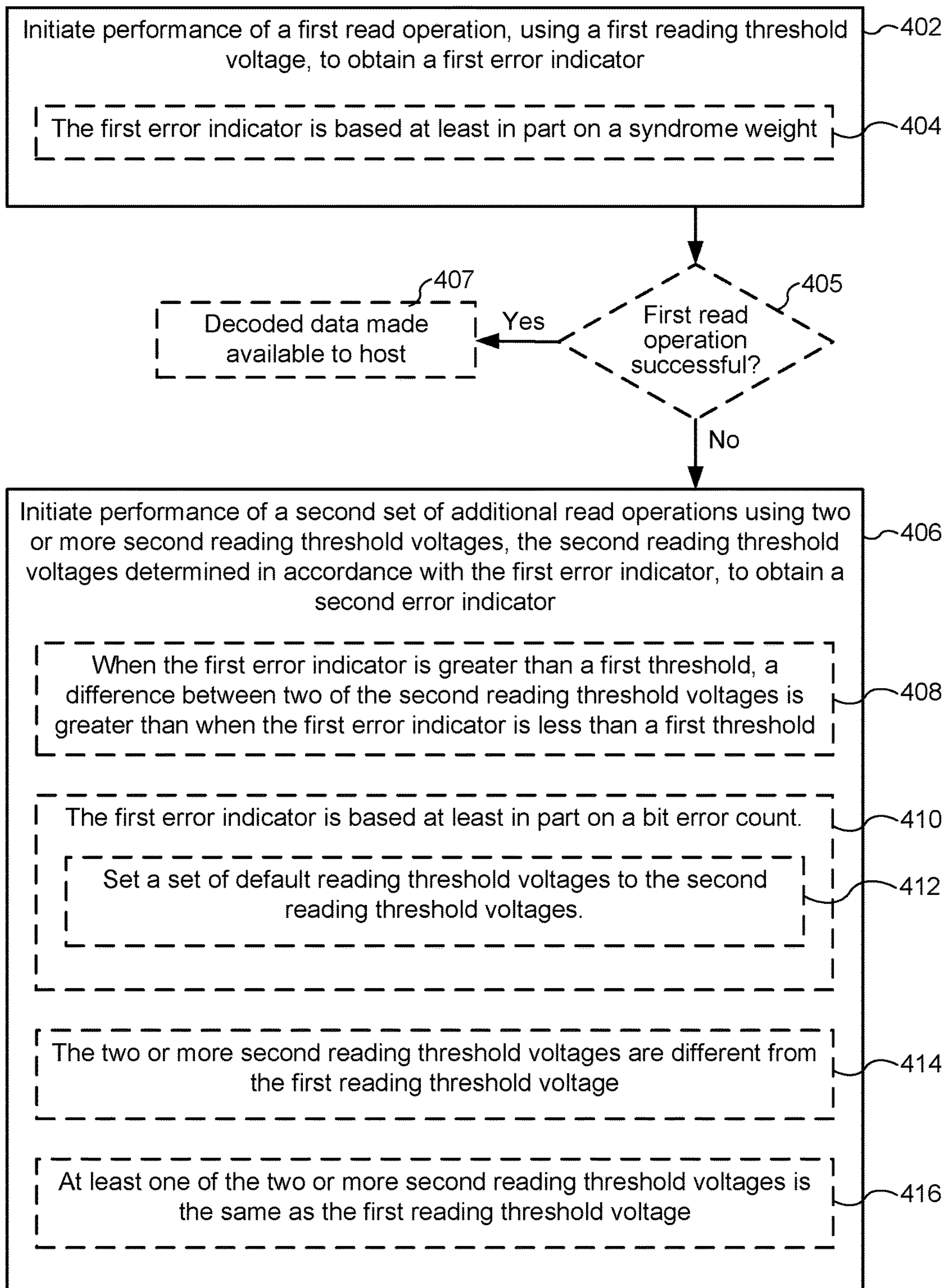
FIGS. 4A-4B illustrate a flowchart representation of a method for reading from a storage medium, in accordance with some embodiments.
Figure 4B:
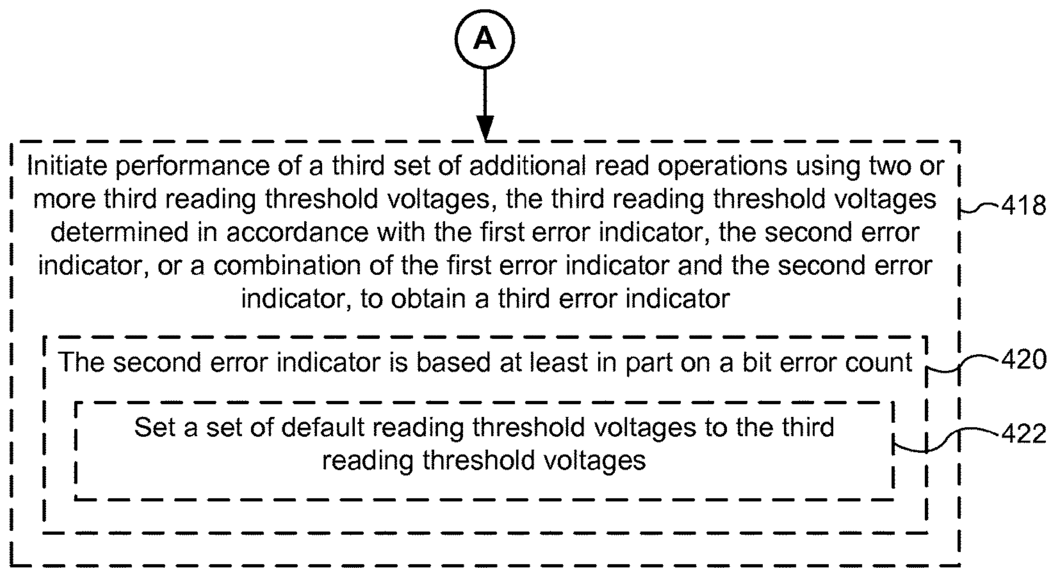

FIGS. 4A-4B illustrate a flowchart representation of a method 400 for reading from a storage medium. As noted above with respect to FIG. 1, a read operation is typically initiated when a computer system (e.g., computer system 110, FIG. 1, sometimes called a host) sends one or more host read commands on control line 111 to memory controller 120 requesting data from storage medium 130. In response, memory controller 120 sends one or more read access commands to storage medium 130, via storage medium I/O 128, which initiates performance of method 400.

At least in some implementations, method 400 is performed by a memory controller (e.g., memory controller 120, FIG. 1) or one or more components of the memory controller (e.g., management module 121, FIGS. 1 and 2) to read from a storage medium (e.g., storage medium 130, FIG. 1). In some embodiments, method 400 is governed by instructions that are stored in a non-transitory computer readable storage medium and that are executed by one or more processors of a device, such as the one or more processing units (CPUs) 122 of management module 121, shown in FIGS. 1 and 2.

A memory controller initiates (402) performance of a first read operation, using a first reading threshold voltage (e.g., reading threshold voltage $V_R$, FIG. 3C, or reading threshold voltage $V_R$, FIG. 3D), to obtain a first error indicator. In some embodiments, the first read operation is primarily performed to obtain data from the storage medium (e.g., storage medium 130, FIG. 1), and secondarily to obtain the first error indicator. FIG. 1, for example, shows management module 121 (a component of memory controller 120) configured to initiate performance of a read operation from storage medium 130 via storage medium I/O 128.

In some embodiments, the first error indicator is (404) based at least in part on a syndrome weight. As explained above, a syndrome weight indicates the number of bit errors detected in a given iteration of the decoding process and a syndrome weight of zero indicates decoding was successful (405—Yes) and the data has been recovered (407).

The memory controller initiates (406) performance of a second set of additional read operations using two or more second reading threshold voltages, the second reading threshold voltages determined in accordance with the first error indicator, to obtain a second error indicator. In some embodiments, the second set of additional read operations are primarily performed to obtain data from the storage medium (e.g., storage medium 130, FIG. 1), and secondarily to obtain the second error indicator. FIG. 1, for example, shows management module 121 (a component of memory controller 120) configured to initiate performance of a set of read operations using two or more reading threshold voltages (e.g., reading threshold voltages VRL1 and VRL2, FIG. 3C, or reading threshold voltages VRH1 and VRH2, FIG. 3D). In some embodiments, step 406 is performed in response to a determination that the first read operation failed (405—No). In some embodiments, step 406 is performed in response to a determination that the syndrome weight is too high to be corrected by 1-Read decoding, as explained above.

In some embodiments, the second error indicator is based at least in part on a syndrome weight. As explained above, a syndrome weight indicates the number of bit errors detected in a given iteration of the decoding process and a syndrome weight of zero indicates decoding was successful and the data has been recovered.

In some embodiments, when the first error indicator is (408) greater than a first threshold, a difference between two of the second reading threshold voltages is greater than when the first error indicator is less than a first threshold. To illustrate, FIG. 3D shows an example of when the error indicator is greater than a first threshold, and thus, the difference between reading threshold voltages $V_{RH1}$ and $V_{RH2}$ is greater than the difference between reading threshold voltages $V_{RL1}$ and $V_{RL2}$ in FIG. 3C, which shows an example of when the error indicator is less than the first threshold.

In some embodiments, the first error indicator is (410) based at least in part on a bit error count. The bit error count is sometimes called a fail bit count, and indicates the number of bit errors detected in the decoding. After successful decoding, the bit error count is available. For example, after a successful 1-Read decoding, the bit error count from the 1-Read decoding is available. In some embodiments, the memory controller sets (412) a set of default reading threshold voltages to the second reading threshold voltages. Using FIG. 3C as an example, when the error indicator is based on a bit error count determined after successful 1-Read decoding using reading threshold voltage $V_R$, the memory controller sets the default reading threshold voltages for subsequent 2-Read decoding to reading threshold voltages $V_{RL1}$ and $V_{RL2}$. As another example, in FIG. 3D, when the error indicator is based on a bit error count determined after successful 1-Read decoding using reading threshold voltage $V_R$, the memory controller sets the default reading threshold voltages for subsequent 2-Read decoding to reading threshold voltages $V_{RH1}$ and $V_{RH2}$.

In some embodiments, the two or more second reading threshold voltages are (414) different from the first reading threshold voltage. For example, FIG. 3C shows two second reading threshold voltages $V_{RL1}$ and $V_{RL2}$ which are different from the first reading threshold voltage $V_R$. As another example, FIG. 3D shows two second reading threshold voltages $V_{RH1}$ and $V_{RH2}$ which are different from the first reading threshold voltage $V_R$.

In some embodiments, at least one of the two or more second reading threshold voltages is (416) the same as the first reading threshold voltage. Using FIG. 3C as an example, in some implementations, the first reading threshold voltage is reading threshold voltage $V_R$ and the second reading threshold voltages are reading threshold voltages $V_{RL1}$ and $V_R$, where at least one of the two second reading threshold voltages is the same as the first reading threshold voltage. Still using FIG. 3C as an example, in some implementations, the first reading threshold voltage is reading threshold voltage $V_R$ and the second reading threshold voltages are reading threshold voltages $V_{RL2}$ and $V_R$, where at least one of the two second reading threshold voltages is the same as the first reading threshold voltage. Referring to FIG. 3D, an additional example of the second reading threshold voltages is reading threshold voltages $V_{RH1}$ and $V_R$, and another example is reading threshold voltages $V_{RH2}$ and $V_R$.

In some embodiments, or in some circumstances, the memory controller initiates (418) performance of a third set of additional read operations using two or more third reading threshold voltages, the third reading threshold voltages determined in accordance with the first error indicator, the second error indicator, or a combination of the first error indicator and the second error indicator, to obtain a third error indicator. In some embodiments, the third set of additional read operations are primarily performed to obtain data from the storage medium (e.g., storage medium 130, FIG. 1), and secondarily to obtain the third error indicator. FIG. 1, for example, shows management module 121 (a component of memory controller 120) configured to initiate performance of a set of read operations using two or more reading threshold voltages. In some embodiments, step 418 is performed in response to a determination that the second set of read operations failed. In some embodiments, step 418 is performed in response to a determination that the syndrome weight is too high to be corrected by 2-Read decoding, as explained above.

In some embodiments, the third error indicator is based at least in part on a syndrome weight. As explained above, a syndrome weight indicates the number of bit errors detected in a given iteration of the decoding process and a syndrome weight of zero indicates decoding was successful and the data has been recovered.

In some embodiments, when the first error indicator, the second error indicator, or a combination of the first and second error indicators is greater than a threshold, a difference between at least two of the third reading threshold voltages is greater than when the first error indicator, the second error indicator, or the combination of the first and second error indicators is less than a threshold.

In some embodiments, the second error indicator is (420) based at least in part on a bit error count. The bit error count is sometimes called a fail bit count, and indicates the number of bit errors detected in the decoding. After successful decoding, the bit error count is available. For example, after a successful 2-Read decoding, the bit error count from the 2-Read decoding is available. In some embodiments, the memory controller sets (422) a set of default reading threshold voltages to the third reading threshold voltages. Using FIG. 3C as an example, when the error indicator is based on a bit error count determined after successful 2-Read decoding using reading threshold voltages $V_{RL1}$ and $V_{RL2}$, the memory controller sets the default reading threshold voltages for subsequent 4-Read decoding to four reading threshold voltages (not shown in FIG. 3C). As another example, in FIG. 3D, when the error indicator is based on a bit error count determined after successful 2-Read decoding using reading threshold voltages $V_{RH1}$ and $V_{RH2}$, the memory controller sets the default reading threshold voltages for subsequent 4-Read decoding to four reading threshold voltages (not shown in FIG. 3D).

In some embodiments, the two or more third reading threshold voltages are different from the first reading threshold voltage. In some embodiments, the two or more third reading threshold voltages are different from the two or more second reading threshold voltages.

In some embodiments, at least one of the two or more third reading threshold voltages is the same as the first reading threshold voltage. In some embodiments, at least one of the two or more third reading threshold voltages is the same as at least one of the two or more second reading threshold voltages.

Figure 5:
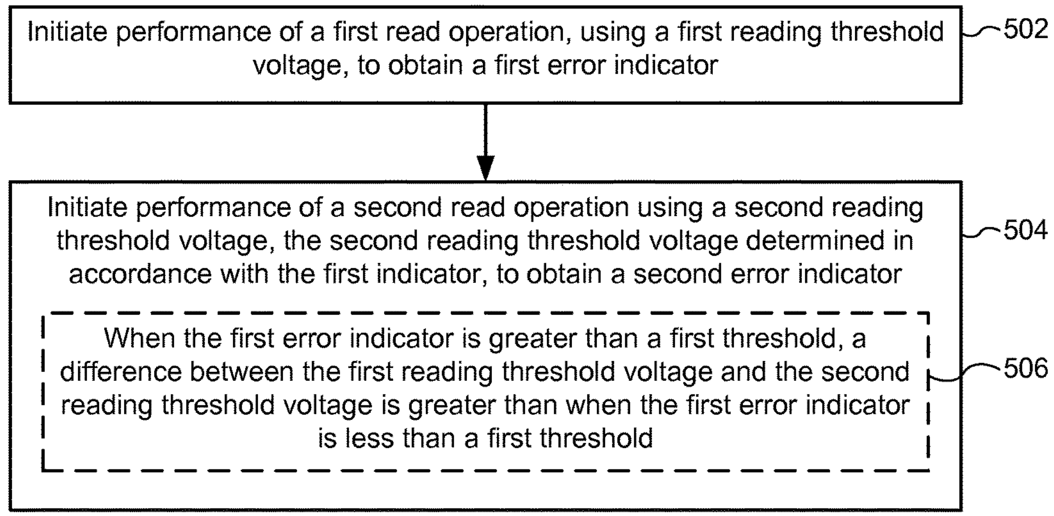
FIG. 5 illustrates a flowchart representation of a method for reading from a storage medium, in accordance with some embodiments.

FIG. 5 illustrates a flowchart representation of a method 500 for reading from a storage medium. As noted above with respect to FIG. 1, a read operation is typically initiated when a computer system (e.g., computer system 110, FIG. 1, sometimes called a host) sends one or more host read commands on control line 111 to memory controller 120 requesting data from storage medium 130. In response, memory controller 120 sends one or more read access commands to storage medium 130, via storage medium I/O 128, which initiates performance of method 500.

At least in some implementations, method 500 is performed by a memory controller (e.g., memory controller 120, FIG. 1) or a component of the memory controller (e.g., management module 121, FIGS. 1 and 2) to read from a storage medium (e.g., storage medium 130, FIG. 1). In some embodiments, method 500 is governed by instructions that are stored in a non-transitory computer readable storage medium and that are executed by one or more processors of a device, such as the one or more processing units (CPUs) 122 of management module 121, shown in FIGS. 1 and 2.

A memory controller initiates (502) performance of a first read operation, using a first reading threshold voltage (e.g., reading threshold voltage $V_R$, FIG. 3C, or reading threshold voltage $V_R$, FIG. 3D), to obtain a first error indicator. In some embodiments, the first read operation is primarily performed to obtain data from the storage medium (e.g., storage medium 130, FIG. 1), and secondarily to obtain the first error indicator. FIG. 1, for example, shows management module 121 (a component of memory controller 120) configured to initiate performance of a read operation from storage medium 130 via storage medium I/O 128.

In some embodiments, the first error indicator is based at least in part on a syndrome weight. As explained above, a syndrome weight indicates the number of bit errors detected in a given iteration of the decoding process and a syndrome weight of zero indicates decoding was successful and the data has been recovered.

The memory controller initiates (504) performance of a second read operation using a second reading threshold voltage, the second reading threshold voltage determined in accordance with the first indicator, to obtain a second error indicator. In some embodiments, the second read operation is primarily performed to obtain data from the storage medium (e.g., storage medium 130, FIG. 1), and secondarily to obtain the second error indicator. FIG. 1, for example, shows management module 121 (a component of memory controller 120) configured to initiate performance of a second read operation using a second reading threshold voltage (e.g., reading threshold voltage $V_{RL1}$ or reading threshold voltage $V_{RL2}$, FIG. 3C, or reading threshold voltage $V_{RH1}$ or reading threshold voltage $V_{RH2}$, FIG. 3D). In some embodiments, step 504 is performed in response to a determination that the first read operation failed. In some embodiments, step 504 is performed in response to a determination that the syndrome weight is too high to be corrected by 1-Read decoding, as explained above.

In some embodiments, the second error indicator is based at least in part on a syndrome weight. As explained above, a syndrome weight indicates the number of bit errors detected in a given iteration of the decoding process and a syndrome weight of zero indicates decoding was successful and the data has been recovered.

In some embodiments, when the first error indicator is (506) greater than a first threshold, a difference between the first reading threshold voltage and the second reading threshold voltage is greater than when the first error indicator is less than a first threshold. As an example, suppose that reading threshold voltage $V_R$ (e.g., in FIGS. 3C and 3D) is the first reading threshold voltage. In the same example, suppose that reading threshold voltage $V_{RH1}$ is the second reading threshold voltage in FIG. 3D and reading threshold voltage $V_{RL1}$ is the second reading threshold voltage in FIG. 3C. As explained above, FIG. 3D shows an example of when the error indicator is greater than a first threshold and FIG. 3C shows an example of when the error indicator is less than a first threshold. In this example, the difference between reading threshold voltage $V_R$ and reading threshold voltage $V_{RH1}$ (e.g., in FIG. 3D) is greater than the difference between reading threshold voltage $V_R$ and reading threshold voltage $V_{RL1}$ (e.g., in FIG. 3C).

In some embodiments, the first error indicator is based at least in part on a bit error count. The bit error count is sometimes called a fail bit count, and indicates the number of bit errors detected in the decoding. After successful decoding, the bit error count is available. For example, after a successful 1-Read decoding, the bit error count from the 1-Read decoding is available. In some embodiments, the memory controller sets a default reading threshold voltage to the second reading threshold voltage.

In some embodiments of method 500, or in some circumstances, the memory controller initiates performance of a third set of additional read operations using two or more third reading threshold voltages, the third reading threshold voltages determined in accordance with the first error indicator, the second error indicator, or a combination of the first error indicator and the second error indicator, to obtain a third error indicator. In some embodiments, the third set of additional read operations are primarily performed to obtain data from the storage medium (e.g., storage medium 130, FIG. 1), and secondarily to obtain the third error indicator. FIG. 1, for example, shows management module 121 (a component of memory controller 120) configured to initiate performance of a set of read operations using two or more reading threshold voltages. In some embodiments, the third set of additional read operations is performed in response to a determination that the second read operation failed, or produced a syndrome weight too high to be corrected, as explained above.

In some embodiments, the third error indicator is based at least in part on a syndrome weight. As explained above, a syndrome weight indicates the number of bit errors detected in a given iteration of the decoding process and a syndrome weight of zero indicates decoding was successful and the data has been recovered.

In some embodiments, the two or more third reading threshold voltages are different from the first reading threshold voltage. In some embodiments, the two or more third reading threshold voltages are different from the second reading threshold voltage.

In some embodiments, at least one of the two or more third reading threshold voltages is the same as the first reading threshold voltage. In some embodiments, at least one of the two or more third reading threshold voltages is the same as the second reading threshold voltage.

In some implementations, with respect to any of the methods described above, the storage medium (e.g., storage medium 130, FIG. 1) is a single flash memory device while in other implementations the storage medium includes a plurality of flash memory devices.

In some implementations, with respect to any of the methods described above, a device operable to read from a storage medium includes a storage medium interface (e.g., storage medium I/O 128, FIG. 1) for coupling the device to the storage medium (e.g., storage medium 130, FIG. 1) and one or more modules, including a memory management module (e.g., management module 121, FIGS. 1 and 2) that includes one or more processors (e.g., CPUs 122, FIGS. 1 and 2) and memory (e.g., memory 206, FIG. 2) storing one or more programs configured for execution by the one or more processors, the one or more modules coupled to the storage medium interface (e.g., storage medium I/O 128, FIG. 1) and configured to perform or control performance of any of the methods described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of reading from a storage medium, the method comprising:

receiving a host read command specifying an address or location in the storage medium from which to read data;

in response to receiving the host read command specifying the address or location in the storage medium from which to read the data:

initiating performance of a first read operation in accordance with the address or location, using a first reading threshold voltage, to obtain a first error indicator value for the first read operation by decoding data obtained from the first read operation;

in accordance with a determination that the first read operation is successful, returning, as a response to the host read command, decoded data produced by said decoding; and in accordance with a determination that the first read operation is unsuccessful:

determining, in accordance with the first error indicator value for the first read operation, second reading threshold voltages, wherein when the first error indicator value for the first read operation is greater than a first threshold, a difference between two of the second reading threshold voltages is greater than a difference between the two second reading threshold voltages that is determined when the first error indicator value for the first read operation is less than the first threshold; and initiating performance of a second set of additional read operations in accordance with the address or location using the two second reading threshold voltages to obtain a second error indicator value for the second set of additional read operations by decoding data obtained from the second set of additional read operations using the two second reading threshold voltages.

2. The method of claim 1, further comprising:

initiating performance of a third set of additional read operations using two or more third reading threshold voltages, the third reading threshold voltages determined in accordance with the first error indicator value for the first read operation, the second error indicator value for the second set of additional read operations, or a combination of the first error indicator value and the second error indicator value, to obtain a third error indicator value for the third set of additional read operations.

3. The method of claim 2, wherein the second error indicator value for the second set of additional read operations is based at least in part on a bit error count, the method further comprising setting a set of default reading threshold voltages to the third reading threshold voltages.

4. The method of claim 1, wherein:

the first error indicator value for the first read operation is based at least in part on a syndrome weight for the first read operation; and the difference between the two second reading threshold voltages is based on a magnitude of the first error indicator value for the first read operation.

5. The method of claim 1, wherein the first error indicator value for the first read operation is based at least in part on a bit error count, the method further comprising setting a set of default reading threshold voltages to the second reading threshold voltages.

6. The method of claim 1, wherein the two second reading threshold voltages are different from the first reading threshold voltage.

7. The method of claim 1, wherein at least one of the two second reading threshold voltages is the same as the first reading threshold voltage.

8. The method of claim 1, wherein the storage medium comprises one or more flash memory devices.

9. A device operable to read from a storage medium, comprising:

a storage medium interface for coupling the device to the storage medium; and one or more modules, including a memory management module that includes one or more processors and memory storing one or more programs configured for execution by the one or more processors, the one or more modules coupled to the storage medium interface and configured to:

receive a host read command specifying an address or location in the storage medium from which to read data;

in response to receiving the host read command, specify the address or location in the storage medium from which to read the data;

initiate performance of a first read operation in accordance with the address or location, using a first reading threshold voltage, to obtain a first error indicator value for the first read operation by decoding data obtained from the first read operation;

in accordance with a determination that the first read operation is successful, returning, as a response to the host read command, decoded data produced by said decoding; and in accordance with a determination that the first read operation is unsuccessful:

determine, in accordance with the first error indicator value for the first read operation, second reading threshold voltages, wherein when the first error indicator value for the first read operation is greater than a first threshold, a difference between two of the second reading threshold voltages is greater than a difference between the two second reading threshold voltages that is determined when the first error indicator value for the first read operation is less than the first threshold; and initiate performance of a second set of additional read operations in accordance with the address or location, using the two second reading threshold voltages to obtain a second error indicator value for the second set of additional read operations by decoding data obtained from the second set of additional read operations using the two second reading threshold voltages.

10. The device of claim 9, wherein the memory management module is further configured to initiate performance of a third set of additional read operations using two or more third reading threshold voltages, the third reading threshold voltages determined in accordance with the first error indicator value for the first read operation, the second error indicator value for the second set of additional read operations, or a combination of the first error indicator value and the second error indicator value, to obtain a third error indicator value for the third set of additional read operations.

11. The device of claim 10, wherein the second error indicator value for the second set of additional read operations is based at least in part on a bit error count, the memory management module further configured to set a set of default reading threshold voltages to the third reading threshold voltages.

12. The device of claim 9, wherein:

the first error indicator value for the first read operation is based at least in part on a syndrome weight; and the difference between the two second reading threshold voltages is based on a magnitude of the first error indicator value for the first read operation.

13. The device of claim 9, wherein the first error indicator value for the first read operation is based at least in part on a bit error count, the memory management module further configured to set a set of default reading threshold voltages to the second reading threshold voltages.

14. The device of claim 9, wherein the two second reading threshold voltages are different from the first reading threshold voltage.

15. The device of claim 9, wherein at least one of the two second reading threshold voltages is the same as the first reading threshold voltage.

16. A device operable to read from a storage medium, comprising:

a storage medium interface for coupling the device to the storage medium;

means for receiving a host read command specifying an address or location in the storage medium from which to read data;

means for initiating performance of a first read operation in accordance with the address or location, using a first reading threshold voltage, to obtain a first error indicator value for the first read operation by decoding data obtained from the first read operation; and means for determining, in accordance with a determination that the first read operation is unsuccessful and in accordance with the first error indicator value for the first read operation, second reading threshold voltages, wherein when the first error indicator value for the first read operation is greater than a first threshold, a difference between two of the second reading threshold voltages is greater than a difference between the two second reading threshold voltages that is determined when the first error indicator value for the first read operation is less than the first threshold;

wherein the means for initiating performance of the first read operation is further configured to initiate, in accordance with the determination that the first read operation is unsuccessful, performance of a second set of additional read operations in accordance with the address or location, using the two second reading threshold voltages to obtain a second error indicator value for the second set of additional read operations by decoding data obtained from the second set of additional read operations using the two second reading threshold voltages.

* * * * *